(12) United States Patent
Maleville (10) Patent No.: US 7,452,584 B2
(45) Date of Patent: *Nov. 18, 2008

(54) METHOD OF INCREASING THE AREA OF A USEFUL LAYER OF MATERIAL TRANSFERRED ONTO A SUPPORT

(75) Inventor: Christophe Maleville, La Terrasse (FR)

(73) Assignee: S.O.I. Tec Silicon on Insulator Technologies, Bernin (FR)

( * ) Notice: Subject to any disclaimer, the term of this patent is extended or adjusted under 35 U.S.C. 154(b) by 225 days.

This patent is subject to a terminal disclaimer.

(21) Appl. No.: 11/348,299

(22) Filed: Feb. 7, 2006

(65) Prior Publication Data

US 2006/0124584 A1 Jun. 15, 2006

Related U.S. Application Data

(62) Division of application No. 10/619,446, filed on Jul. 16, 2003, now Pat. No. 7,048,867.

(60) Provisional application No. 60/468,990, filed on May 9, 2003.

(30) Foreign Application Priority Data

Jul. 17, 2002 (FR) ................... 02 09017

(51) Int. Cl.
  *B32B 3/02* (2006.01)
(52) U.S. Cl. .................................. 428/66.7
(58) Field of Classification Search ............... 428/66.7; 257/E21.122

See application file for complete search history.

(56) References Cited

U.S. PATENT DOCUMENTS 5,152,857 A 10/1992 Ito et al. ................ 156/153

5,374,564 A 12/1994 Bruel ...................... 437/24
5,597,410 A 1/1997 Yen ........................ 117/84
6,113,721 A * 9/2000 Secco d'Aragona et al. 156/154
6,429,104 B1 8/2002 Auberton-Herve ......... 438/527
6,664,169 B1 12/2003 Iwasaki et al. ............. 438/409
2001/0055854 A1 12/2001 Nishida et al. ............. 438/455

(Continued)

FOREIGN PATENT DOCUMENTS

EP  1 189 266 A1  3/2002

(Continued)

OTHER PUBLICATIONS

M.K. Weldon et al., "Mechanism of Silicon Exfoliation by Hydrogen Implantation and He, Li and Si Co-implantation," Proceedings 1997 IEEE International SOI Conference, Oct. 1997, pp. 124-125.

*Primary Examiner*—Alexander Thomas
(74) *Attorney, Agent, or Firm*—Winston & Strawn LLP (57) ABSTRACT

A composite structure in accordance with the invention includes front faces of first and second substrates that are molecularly bonded to each other, wherein the dimensions of the second substrate outline are larger than the first substrate outline. The front faces are molecularly bonded such that the outline of the first front face is disposed at least partially within the outline of the second front face. A peripheral ring extends around the first front face and facing the first substrate, in which bonding between the front faces is weak or absent, and has a maximum width of less than about 0.5 mm.

16 Claims, 3 Drawing Sheets

U.S. PATENT DOCUMENTS

| | | | |
|---|---|---|---|
| 2003/0008478 A1 | 1/2003 | Abe et al. | 438/459 |
| 2004/0035525 A1 | 2/2004 | Yokokawa et al. | 156/281 |
| 2004/0224482 A1 | 11/2004 | Kub et al. | 438/458 |

FOREIGN PATENT DOCUMENTS

| | | |
|---|---|---|
| EP | 1 059 663 A2 | 12/2002 |
| JP | 06-61201 | 3/1994 |
| JP | 10-93122 | 4/1998 |

* cited by examiner

METHOD OF INCREASING THE AREA OF A USEFUL LAYER OF MATERIAL TRANSFERRED ONTO A SUPPORT

CROSS-REFERENCE TO RELATED APPLICATIONS

This application is a division of application Ser. No. 10/619,446 filed Jul. 16, 2003, now U.S. Pat. No.7,048,867, which claims the benefit of provisional application No. 60/468,990 filed May 9, 2003. The entire content of each prior application is expressly incorporated herein by reference.

FIELD OF THE INVENTION

The present invention relates to a method of increasing the area of a useful layer of semiconductor material which is effectively transferred onto a support during the fabrication of substrates, in particular for use in electronics, optics, or optoelectronics.

BACKGROUND OF THE INVENTION

Currently, substrates fabricated using techniques combining bonding by molecular bonding (known as "wafer bonding") and transferring a useful layer onto a support have a zone known as a "peripheral ring". This peripheral ring is a zone located at the periphery of the support in which transfer of the useful layer has not occurred. The peripheral ring also includes a zone in which the useful layer has been transferred only partially or has disappeared during subsequent treatment due to its poor bonding to the support.

Figure 1:
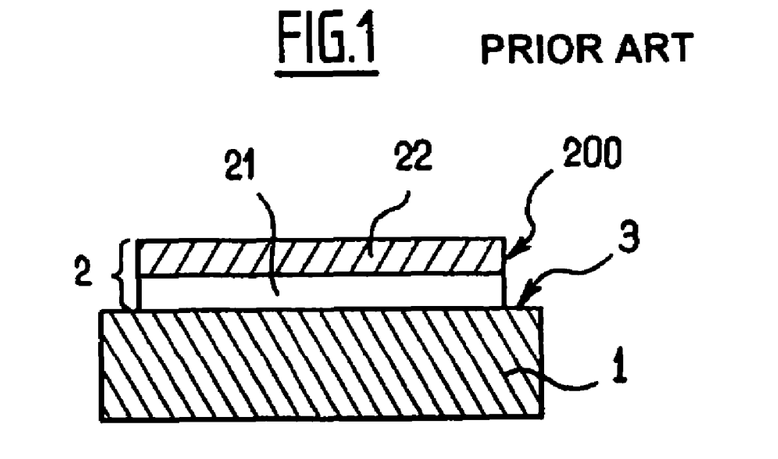
FIG. 1 is a diagram showing a vertical diametrical cross-section through an SOI type substrate.
Figure 2:
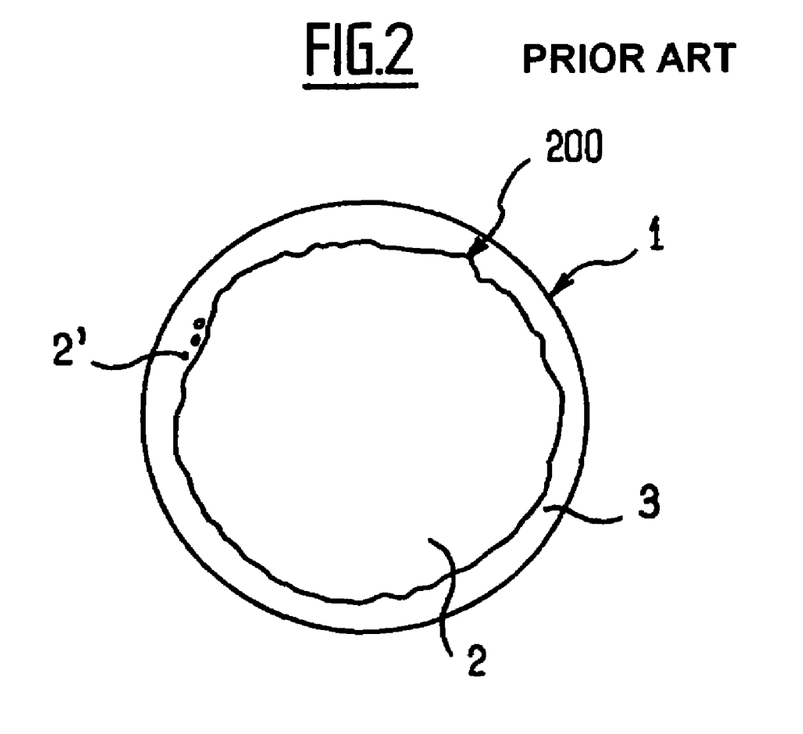
FIG. 2 is a diagrammatic plan view of the substrate of FIG. 1.

Accompanying FIGS. 1 and 2 are respective cross-sectional and plan views of a substrate that is known to the skilled person under the acronym "SOI," meaning "silicon on insulator". FIG. 1 shows a support 1 of silicon onto which a composite layer 2, comprising a layer of silicon oxide 21 surmounted by a layer of silicon 22, has been transferred by molecular bonding.

Peripheral ring 3 defines a substantially annular zone of support 1 onto which the composite layer 2 has either not been transferred or has been transferred poorly or incompletely to a substantial level during transfer of the layer. In the plan view of FIG. 2, it can be seen that this ring 3 is typically of varying width and/or shape, i.e. that the vertical side 200 of the composite layer 2 can be irregular and jagged Islands 2' of composite layer may exist, which have been transferred onto the support 1, but which are spaced apart from the remainder of the central portion of said composite layer 2. It should be noted that FIGS. 1 and 2 are diagrams that are not to scale both as regards the thickness of the different layers and of the support and as regards the width of the ring.

This ring phenomenon occurs with other substrates, for example those known under the acronym "SICOI" meaning "silicon carbide on insulator" or under the acronym "SOQ" meaning "silicon on quartz". Other multi-layer substrates, such as those comprising gallium arsenide on silicon (AsGa/Si), also exhibit said ring.

Independently of the diameter of support 1, which typically varies, for example, from 2 inches (50 millimeters (mm)) for silicon carbide to 12 inches (300 mm) for certain silicon substrates, the ring 3 generally varies from about 1 mm to about 4 mm in width, typically plus-or-minus 0.5 mm. Further, the width of the ring 3 can fluctuate, i.e., it can be smaller on one side of the substrate than on the other.

The appearance of the rings during layer transfer has a variety of origins and causes, as discussed below. Certain factors that can cause ring 3 to appear include chamfers on the substrates used, variations in bonding energy between layer 2 and the supports, and finally certain aggressive steps in substrate fabrication methods.

Figure 3:
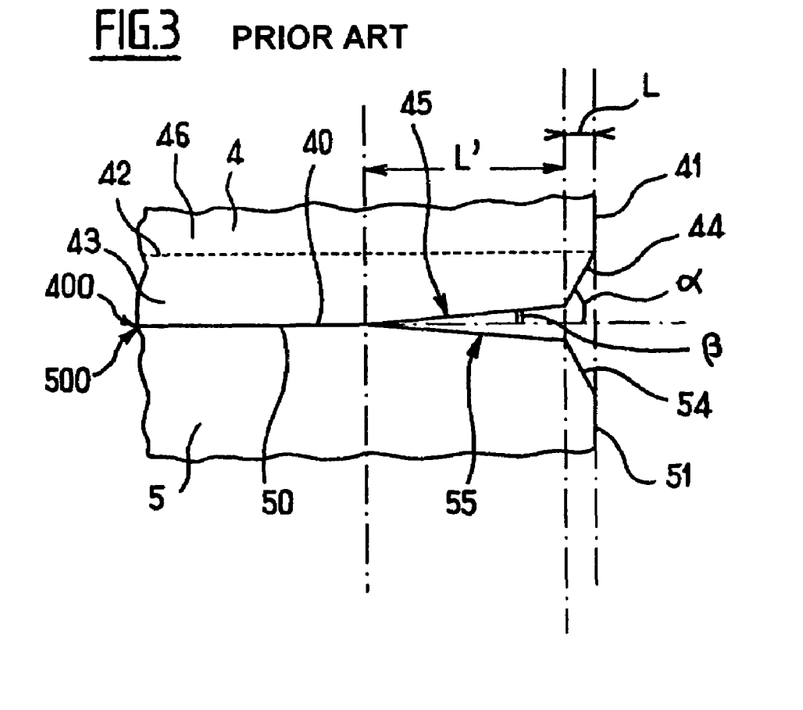
FIG. 3 is a diagrammatic fragmentary vertical cross-section of a source substrate and a support substrate bonded together using a prior art technique.

In order to explain how ring 3 typically appears, reference is made to the accompanying FIG. 3 which is a diagrammatic cross-section of a portion of the sides of two substrates bonded together by molecular bonding. A source substrate 4 is preferably a layer from which the future useful layer is to be cut, and a support substrate 5 is selected to receive the useful layer. This figure illustrates the prior art. In the remainder of the description and drawings, the substrates are assumed to be circular in shape, as this is the shape used most frequently. Other shapes can alternatively be used.

The source substrate 4 has two opposite faces that are parallel in most desired applications. In FIG. 3 reference numeral 400 designates what will be referred to herein as a front face of the opposite faces. The front face 400 is intended and prepared for bonding onto the support 5.

The source substrate 4 has a side 41, which can be a peripheral side. Further, the substrate 4 preferably undergone treatment that forms a zone or region of weakness 42 that defines two portions: a rear portion 46 and a useful layer 43. The useful layer 43 is intended for transfer to the support 5. Throughout the remainder of the description, the expression "useful layer" refers to the transferred layer. The thickness of the useful layer typically depends on whether it is obtained, for example, by a method of implanting atomic species or by abrasive polishing and/or chemical etching as is described below.

In one embodiment, the substrates used both as the source substrate and as the support substrate are commercially available substrates satisfying standardized requirements (for example SEMI M1-0302 standards for a silicon substrate). Those standards are mainly concerned with ensuring that the substrates can be accepted by the equipment of as wide a range of users as possible. According to these standards, at the intersection between the side 41 and the front face 400, the substrate 4 has an annular primary chamfer 44 or primary drop oriented at an angle $\alpha$, which can be large and close to 45°, with the extension thereof, and more precisely with the central zone 40, which is preferably flat to a high degree of precision, as will be explained below. The primary chamfer 44 extends over a width L in the radial direction parallel to the front face 400. Width L generally varies from about 100 micrometers ($\mu$m) to about 500 $\mu$m, depending on the substrates used. The primary chamfer 44 is intended to limit the risk of mechanical breakage and notching of the source substrate 4.

In a similar manner to that just described for the source substrate 4, the support substrate 5 also has a front face 500, a side 51 and a primary chamfer 54 according to typically present standards. When substrates 4 and 5 of the prior art are bonded to each other, bonding does not occur at chamfers 44 and 54 because of the magnitude of angle $\alpha$. The width of the rings can thus be expected to generally correspond to the width L of the primary chamfers 44 and 54. In practice, however, the width of FIG. 3 is typically even wider.

It has been observed that the front face 400 of substrate 4 actually has two zones, namely a first flat zone 40 located substantially at the center of the substrate 4 and hereinafter also termed the "flat central zone," and a second zone 45 surrounding the first zone 40.

The second zone 45 is a secondary chamfer, which is generally annular, or a secondary drop, forming an angle $\beta$ with the plane of the flat central zone 40. The secondary chamfer of second zone 45 extends between the flat zone 40 and the primary chamfer 44.

Throughout the remainder of the description and claims, the expression "flat" means a flatness that is suitable for bonding. The expression "central zone" designates a zone located substantially centrally or even at the center of the front face of the substrate and which can be located at various degrees of eccentrically, and most preferably, located slightly eccentrically on the front face 400.

It should be noted that as FIG. 3, the following figures are only diagrammatic in nature and the magnitude of angle β has been considerably exaggerated in the figures for clarification purposes. More precisely, the secondary chamfer 45 a drop that is less sharp than the primary chamfer 44 and that appears during the various substrate shaping steps such as lapping, polishing, and chemical etching, which steps produce an etching and material-removal effect that is greater near the substrate side 41. The secondary chamfer 45 is presently not subject to industry standards. Its width L' taken in a radial direction varies from about 500 μm to 3000 μm on substrates that are commercially available on the market. Further, the value of angle β also fluctuates, and the secondary chamfer 45 is not flat in cross-section as shown diagrammatically in FIG. 3 but can be domed or irregular in places.

As a result, in practice, and in contrast to the diagrammatic representation of the figures, the side of the source substrate 4 is not formed by a plurality of beveled slopes, but instead by an overall convex shape, typically without edges between the secondary chamfer 45 and the primary chamfer 44 or between the primary chamfer and the side 41. The purpose of the convex shape is to avoid any nicking of the substrate 4.

In a manner similar to that just described for the source substrate 4, the support substrate 5 has a flat central zone 50 and a substantially annular secondary chamfer 55, but has similar irregularities to the secondary chamfer 45.

Molecular bonding is a technique that does not tolerate substantial non-planar surfaces, the existence of secondary chamfers 45, 55 results in poor bonding and layer transfer in the zone of these surfaces, resulting in the appearance of a peripheral ring 3. In addition, a second reason for the appearance of the ring 3 is that the bonding energy between two facing substrate faces fluctuates as a function of parameters such as roughness, flatness and the chemical nature of the surfaces in contact, the presence of particles and impurities, etc. These parameters can also vary in a less controlled manner at the sides of the substrates, thereby also contributing to the formation of the ring 3.

Finally, another possible cause for formation of the ring 3 is the use of certain aggressive or vigorous steps during the substrate fabrication methods.

Methods of fabricating substrates known under the acronym BESOI (bond and etchback silicon on insulator) bond a source substrate onto a support substrate, at least one of the faces of the source substrate being coated with a layer of oxide. The exposed surface of the source substrate then undergoes an abrasive polishing and/or chemical attack etching treatment, followed by polishing until the source substrate becomes a useful layer. In this type of method involving chemical attack (with the risk of partial delamination of the bonding interface), oxidation affecting the lateral and frontal portions of the source substrate, and mechanical abrasive polishing forces, both tend to enlarge the ring 3.

Similarly, in methods involving detachment of a layer by fracture along a zone of weakness, it has been observed that around the peripheral sides collective structure of the bonded substrates, detachment often tends to occur at the bonding interface instead of at the zone of weakness, resulting in the formation of an annular ring 3, sometimes with a large surface area.

Referring again to FIG. 3, in the case in which the zone of weakness 42 is formed by implantation of atomic species, such as by hydrogen implantation, it has been observed that, during subsequent treatment to detach the useful layer 43 from the remainder of the source substrate 4, expansion of hydrogen bubbles exerts a substantially perpendicular force on the surface of the secondary chamfer 45. In the zone of the secondary chamber 45, this force is often not compensated by sufficiently strong bonding since the secondary chamfer 55 of the support 5 is spaced from the secondary chamfer 45 of the useful layer 43 by an angle 213, or the addition of the angles 13 if the angle of each opposing chamfer is different, and the bonding is thus ruptured. Thus, bubbles are formed at the surface of the secondary chamfer 45 instead of at the surface or edge of the layer 43 being transferred onto the support substrate 5. In other words, bonding occurs but its quality is poor in this area.

A number of disadvantages are associated with the existence of said ring 3. First, it is not possible to fabricate electronic components on the surface of this ring 3. Unfortunately, from an economic point of view, each extra square millimeter of area can make it possible to fabricate a larger number of components per substrate. Furthermore, this ring is irregular as explained above, and its width can vary from one side to the other of the substrate, thus giving rise to problems of reproducibility in the various steps of an industrial process when such a substrate is used in a production facility.

The prior art includes methods of polishing the side of a substrate so as to make it possible to eliminate the ring 3, see for example document U.S. Pat. No. 6,221,774. A method of mechanically polishing sides is also known as used by the supplier SEZ. This method is used on solid silicon substrates after deposition operations, which are known to run the risk of being associated with the effects of material being removed from the sides (known as "lift-off" or "peel-off"), i.e. leading to a high level of particulate contamination. Nevertheless, those methods tend to increase the size of the zone that has no transferred layer at the periphery, thereby restricting the useful area. In addition, finishing operations on the ring can lead to defects at the periphery of the transferred layer.

SUMMARY OF THE INVENTION

The present invention relates substrates prepared by methods for transferring a first substrate or a portion thereof to a second substrate, which are preferably crystalline and of bulk material, to provide improved bonding between the substrates. In the preferred method, first and second front faces of first and second substrates, respectively, are bonded to each other to provide a composite structure. The second front face has dimensions larger than the first front face, and the front faces are positioned during bonding so at least a portion of the outline of the first front face is disposed within the outline of the second front face.

The first front face is preferably completely disposed within the outline of the second front face during the bonding. This is done to minimize the size of a peripheral region about the first front face outline and within a region of overlay between the first and second front faces in which the bonding between the faces is weak or absent. Preferably the width of the peripheral ring at its maximum is less than about 0.5 mm, more preferably less than 0.2 mm. A useful layer is provided from a donor substrate, which comprises the first or second substrate adjacent the bonded face thereof.

Preferably, the useful layer is of semiconductor material. In a preferred embodiment, both the first and second substrates can be made of a semiconductor material, most preferably at least at the front faces. The preferred useful layer produced is useful for producing an electronic, optic, or optoelectronic component or substrate.

In the preferred method, the useful layer is separated from a donor portion of the donor substrate of the composite structure to provide a product wafer that includes the useful layer. The useful layer can be separated from the donor portion by splitting. The splitting, in turn, can be accomplished in several manners, including by forming a zone of weakness between the useful layer and the donor portion to facilitate and locate the splitting of the useful layer from the donor portion. The zone of weakness may be formed, for example, by implantation of atomic species or by providing a porous layer. The useful layer is preferably separated by applying electrical or mechanical stress to, supplying thermal energy to, or chemically etching the composite structure, or by combinations thereof.

The first substrate can comprises a first primary chamfer extending around the first front face and can have a primary chamfer outline that is at least partially disposed within the outline of the second front face during bonding. This primary chamfer outline is preferably disposed substantially entirely within the second front face during bonding. Additionally, the front faces preferably are substantially parallel and corresponding in surface shape, and are preferably substantially flat. At least one of the front faces can comprise an insulator. With round faces or cylindrical substrates, the second front face or second substrate preferably has a diameter 0.3 mm greater than the first front face or first substrate.

A preferred composite structure in accordance with the invention includes front faces of the first and second substrates that are molecularly bonded to each other. The dimensions of the second substrate outline are larger than the first substrate outline. The front faces are molecularly bonded such that the outline of the first front face is disposed at least partially within the outline of the second front face. A peripheral ring extending around the first front face and facing the first substrate, in which bonding between the front faces is weak or absent, has a maximum width of less than about 0.5 mm.

BRIEF DESCRIPTION OF THE DRAWINGS

Other characteristics and advantages of the invention become apparent from the following description of several preferred implementations of the invention. This description is made with reference to the accompanying drawings in which.

DETAILED DESCRIPTION OF THE PREFERRED EMBODIMENTS

The present invention reduces the area of the peripheral ring by increasing the quantity of material taken from the source substrate that is transferred onto a support during a layer transfer process. To this end, the invention provides a method of increasing the area of a useful layer of a material, in particular a semiconductor material, transferred onto a support substrate, during the fabrication of a composite substrate in particular for electronics, optics, or optoelectronics, the method comprising at least one step of molecular bonding a "front" face of a source substrate to a "front" face of a support substrate. Each of the front faces are preferably substantially parallel and corresponding in surface shape. Most preferably, the corresponding shape of the front faces has a substantially flat central zone with a respective outline. The useful layer from source substrate transferred onto the support substrate, with the useful layer including a portion of the source substrate extending to the front face.

The dimensions of the outer outline of one of the source and support substrates, referred to as the "first" substrate, are greater than the dimensions of the outer outline of the other of the substrates, referred to as the "second" substrate. The outer outline of said flat zone of the first substrate has dimensions greater than the dimensions of the outer outline of the flat central zone of the second substrate. During bonding, the substrates are applied one against the other in such a manner that the outline of the flat central zone of the second substrate is disposed within the outline of the flat central zone of the first substrate, and preferably completely there within. This permits the useful layer to be transferred over an area that is larger.

According to other advantageous and non-limiting characteristics of the invention, taken singly or in combination:

the source substrate and the support substrate are preferably of circular cross-section, and the outside diameter of the first substrate is greater than the outside diameter of said second substrate;

the second substrate can be surrounded by a primary chamfer. The dimensions of the outer outline of the flat central zone of the first substrate are preferably greater than the dimensions of the inner outline of the primary chamfer of the second substrate. During bonding, the substrates are applied one against the other in such a manner that the inner outline of the primary chamfer of the second substrate is disposed inside the outer outline of the flat central zone of the first substrate;

the second substrate is preferably bonded to the first substrate in such a manner that the flat central zone of the second is substantially centered relative to the flat central zone of said first substrate;

the first substrate is preferably the source substrate;

prior to the step of bonding the source substrate and the support substrate to or placing them against each other, the method can include forming a zone of weakness inside said source substrate. The useful layer to be transferred is formed to extend between the zone of weakness and the front face of the substrate. After the bonding step, the useful layer is detached from the remainder of the source substrate along the zone of weakness;

said zone of weakness can be formed by implanting atomic species by providing a porous layer;

the useful layer can be detached, for example, by at least one of the following techniques taken alone or in combination: applying stresses of mechanical or electrical origin, supplying thermal energy, and chemical etching;

the front face of the source substrate or the front face of the support substrate or both can be coated in a layer of an insulating material.

The invention improves the methods of fabricating a composite substrate. A preferred method includes at least one step of molecular bonding one of the faces of a source substrate to a face of a support substrate and a step of transferring a useful layer from the source substrate onto the support substrate. The resulting composite substrate thus comprises at least one useful layer transferred onto a support.

Figure 5:
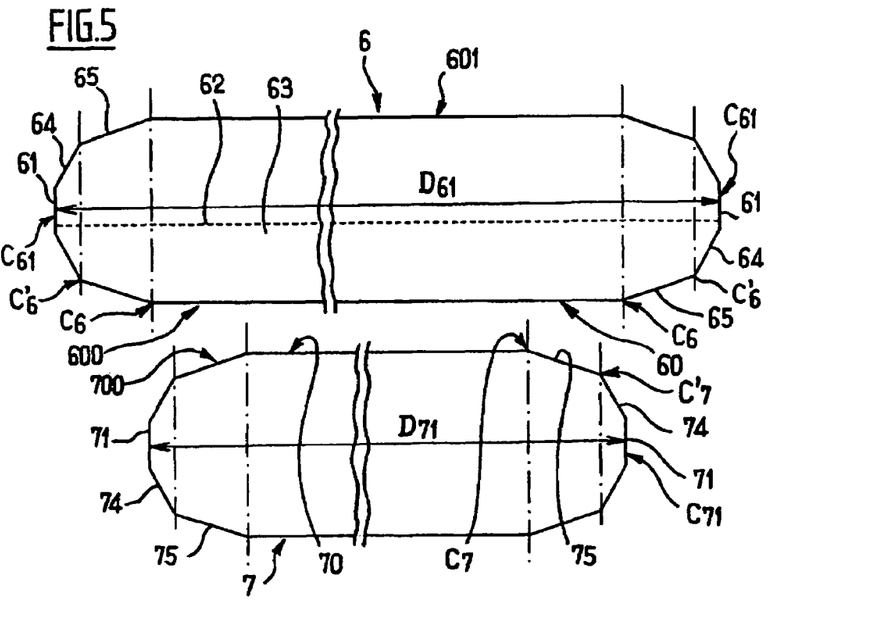
FIG. 5 is a fragmentary diagrammatic vertical cross-section showing a source substrate of one embodiment of the invention, the two substrates being shown ready for bonding together.

With reference now to FIG. 5, there can be seen a first embodiment of a composite structure of the invention, in which a source substrate 6 (from which a useful layer 63 is to be taken subsequently) is molecularly bonded to a support substrate 7. In this embodiment, the support substrate 7 is the same the support substrate 5 described above and shown in FIG. 3, although in alternate embodiments. It is therefore not described again in detail. The support substrate 7 has a side 71, a primary chamfer 74, and a front face 700 for receiving the front face 600 of the source substrate 6. The front face 700 of the support substrate 7 includes both a flat central zone 70 and a secondary chamfer 75.

Figure 4:
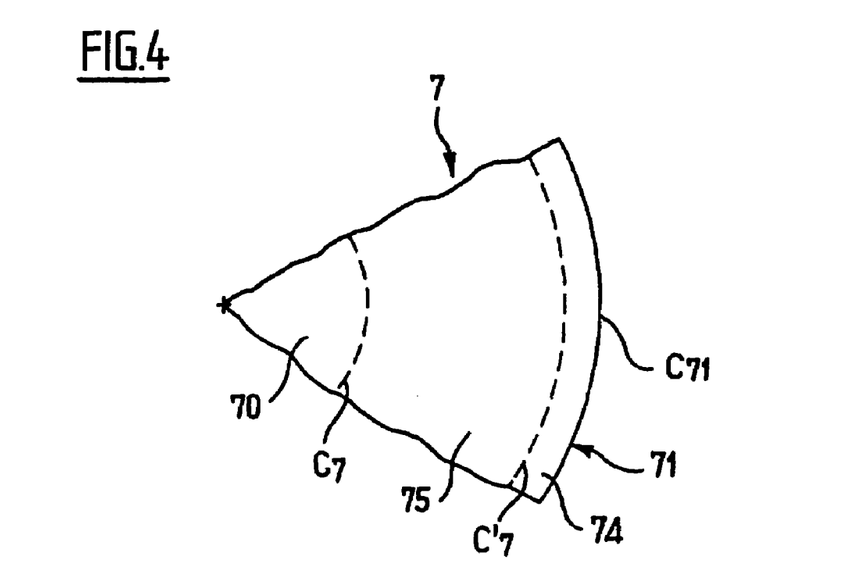
FIG. 4 is a plan view of an angular section of a support used in the method of the invention.
Figure 6:
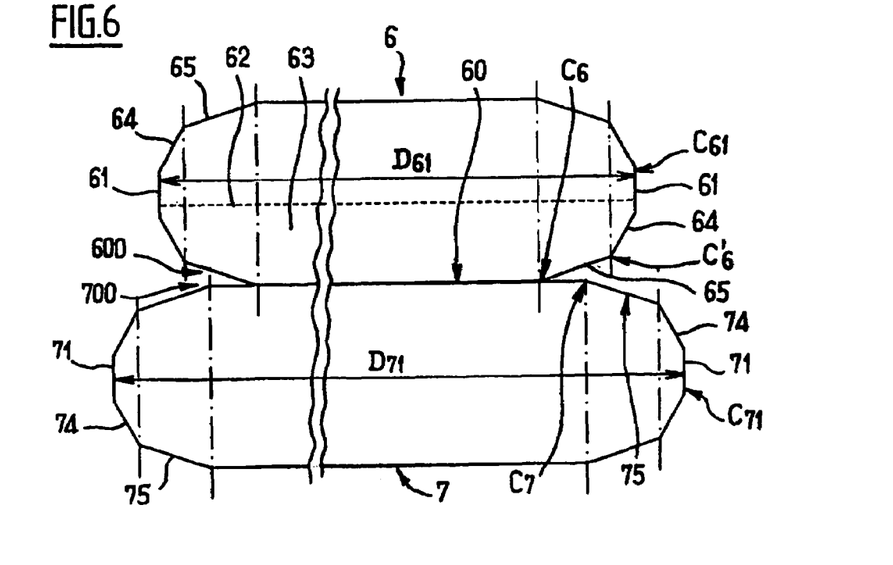
FIG. 6 is a fragmentary diagram in vertical section showing a source substrate and a support substrate in a second implementation of the method, the two substrates being shown bonded together.

Referring to FIGS. 4 to 6, the preferred source and support substrates 6 and 7 are circular in plan view. Similarly, their flat central zones are likewise circular, and the primary and secondary chamfers are described as being annular. Nevertheless, the substrates 6 and 7 and/or their respective central zones an alternatively be of other shape. For example, they could be oval, octagonal, or rectangular.

As can be seen more clearly in FIG. 4, the secondary chamfer 75 is defined between an inner outline $C_7$ and by an outer outline $C'_7$. It should be observed that the inner outline $C_7$ of the secondary chamfer 75 constitutes the outer outline of the flat central zone 70. Similarly, the outer outline $C'_7$ of the secondary chamfer 75 defines the inner outline of the primary chamfer 74.

As shown in FIG. 5, the source substrate 6 of this embodiment is a conventional substrate in that it has a primary chamfer 64 and possibly also a secondary chamfer 65. The secondary chamfer lies between an inner outline $C_6$ and an outer outline $C'_6$.

In this embodiment, the dimensions of the outer outline $C_{61}$ of the source substrate 6 taken at its side 61 are greater than the dimensions of the outer outline $C_{71}$ of the support substrate 7 taken at its outermost peripheral side 71.

When both substrates 6 and 7 are circular in plan view, the greatest diameter $D_{61}$ (referred to below as the outside diameter $D_{61}$) of the source substrate 6, i.e. the diameter as measured across the side 61 is larger than the outside diameter $D_{71}$ of the support substrate 7 (as measured across the side 71).

Given the usual fabrication tolerances on the substrates 6 and 7, it is preferable in practice for the source substrate 6 to have a diameter $D_{61}$ that is at least 0.3 mm greater than the diameter $D_{71}$ of the support substrate 7, more preferably at least 0.4 mm greater, and more preferably 0.5 mm greater. In one embodiment, the diameter $D_{61}$ is less than 2.5 mm greater than the diameter $D_{71}$, more preferably less than 1.5 mm greater, and most preferably less than 1 mm greater. Furthermore, when commercially-available substrates 6 and 7 are used of the kind that are made available in the form of a range of substrates of discretely different increasing diameters, it is advantageous for the substrate 6 to be selected as having the diameter in the range that is the diameter immediately larger than that of the support substrate 7. Standardized substrate diameters presently available include 2 inch, 3 inch, 4 inch, 5 inch, 6 inch, 8 inch, and 300 mm diameters.

In addition, the dimensions of the outer outline $C_6$ of the flat central zone 60 of the source substrate 6 are greater than the dimensions of the outer outline $C_7$ of the flat central zone 70 of the support substrate 7. During bonding, the source substrate 6 is applied against the support substrate 7 in such a manner that the outline $C_7$ is contained within the outline $C_6$. Also, the dimensions of the outline $C_6$ of the flat central zone 60 of the source substrate 6 are preferably greater than the dimensions of the inner outline $C'_7$ of the primary chamfer 74 of the support 7. During bonding, the source substrate 6 is applied against the support substrate 7 in such a manner that the inner outline $C'_7$ is contained within the outline $C_6$.

Thus, the secondary chamfer 75 of the support 7 can be ensured to be situated facing the flat zone 60 of the substrate 6 and forms a small angle β relative thereto. Bonding between the surfaces of these two portions is improved and a larger fraction of the useful layer 63 is transferred onto the secondary chamfer 75. Consequently, the area of the useful layer 63 that is actually transferred via the inventive method is increased compared to the prior art, and conversely the area of the peripheral ring is decreased Preferably, the source substrate 6 is bonded to the support substrate 7 in such a manner that the flat central zone 70 of the support 7 is centered relative to the central zone 60 of the source substrate 6. Thus, the useful layer 63 as transferred is also centered or substantially centered relative to the support 7.

A second embodiment of the invention is described below with reference to FIG. 6. This embodiment is similar to that described with reference to FIG. 5, except that the support substrate 7 has a diameter $D_{71}$ that is larger than the diameter $D_{61}$ of the source substrate 6.

In this embodiment, the dimensions of the outer outline $C_{71}$ of the support substrate 7 are greater than the dimensions of the outer outline $C_{61}$ of the source substrate 6. When both substrates are circular in plan view, the diameter $D_7$ of the support 7 is greater than the diameter $D_6$ of the source substrate 6. The remarks made above relative to the first implementation concerning the difference in diameter between the substrates being at least 0.3 mm and concerning the use of commercially-available substrates of a different sizes applies likewise in this second embodiment. In addition, the dimensions of the outer outline $C_7$ of the flat zone 70 of the support 7 are greater than the dimensions of the outer outline $C_6$ of the flat central zone 60 of the source substrate 6. During bonding, the source substrate 6 is applied against the support substrate 7 in such a manner that this outline $C_6$ is contained within the outline $C_7$.

Also preferably, the dimensions of the outline $C_7$ are greater than the dimensions of the inner outline $C'_6$ of the primary chamfer 64 of the source substrate 6. During bonding the source substrate 6 is applied against the support substrate 7 in such a manner that the inner outline $C'_6$ is contained inside said outline $C_7$. Preferably, the substrates 6 and 7 are also centered relative to each other.

Of the two implementations described above, the embodiment of FIG. 5, in which the source substrate 6 is of dimensions greater than those of the support substrate 7, is generally preferred as this facilitates implementing the method on an industrial scale.

Whatever the dimensions selected for the substrates 6 and 7, the useful layer 63 can be removed from the source substrate 6 in a variety of manners that are now described.

In one embodiment, prior to the step of molecular bonding substrates 6 and 7 to each other, a zone of weakness 62 is formed within the source substrate 6 to define and delimit the useful layer 63 that is to be subsequently transferred to the support 7. After bonding, the useful layer 63 is detached from the remainder of the source substrate 6 along this zone of weakness 62. It should be observed that FIGS. 5 and 6 are merely diagrammatic and, for clarification purposes, the useful layer 63 is shown therein as being much thicker than it is in reality in this embodiment.

Techniques for forming the zone of weakness 62 are known to the skilled person and are not all described in detail. The zone of weakness 62 can be formed, for example, by implanting atomic species from the front face 600. The term "implanting atomic species" means any bombardment of atomic, molecular or ionic species, which can introduce said species into a material with a maximum concentration of said species located at a predetermined depth from the bombarded surface 600. The molecular or ionic atomic species are introduced into the material with an energy that is also distributed about a maximum.

Atomic species can be implanted into the source substrate 6 using an ion beam implanter or a plasma immersion implanter, for example. Preferably, implantation is carried out by ionic bombardment. Preferably, the implanted ionic species is hydrogen. Other ionic species can advantageously be used alone or in combination with hydrogen, such as rare gases.

Implantation creates the zone of weakness 62 within the bulk of the source substrate 6 and at a mean ion penetration depth. The zone of weakness 62 is preferably substantially parallel to the plane of the front face 600. The useful layer 63 extends from the front face 600 to this zone of weakness 62.

A preferred method of transferring the useful layer 63 is known as SMART-CUT®. The zone of weakness 62 can alternatively be provided by a porous layer obtained, for example, using the method known as ELTRAN® of Canon, which is described in European patent EP-A-0 849 788.

After the step of molecular bonding of the faces 600 and 700, the useful layer 63 is detached from the remainder of the source substrate 6. Detachment of the useful layer 63 is preferably performed by at least one of the following techniques, alone or in combination: applying constraints of mechanical origin (inserting a blade or a jet of fluid under pressure into the zone of weakness 62) or of electrical origin, supplying heat energy, and chemical etching. These detachment techniques are known to the skilled person. This provides a composite substrate or product wafer having a useful layer 63 transferred onto a support 7.

As mentioned above, the useful layer 63 is preferably detached horizontally, along the zone of weakness 62. The thickness of the useful layer 63 detached is also in part determined by a "vertical self-limitation," which is vertically in register with the zone where bonding to the support is of sufficient strength to transfer the useful layer 63.

It is alternatively possible to produce the useful layer 63 by the technique known as "bond and etchback", in which, after bonding the front face 600 of the source substrate 6 onto the front face 700 of the support substrate 7, the rear face 601 of said source substrate 6 undergoes treatment by lapping and/or etching by chemical attack, typically followed by polishing, until only the thickness corresponding to said useful layer 63 remains on the support 7. In the case of SOI (silicon on insulator) substrates, it is possible to obtain the useful layer 63 by the BESOI mentioned above.

Examples of materials to which said method can be applied follow. The support substrate 7 is preferably formed from a material that is optionally a semiconductor and that is selected, for example, from silicon, a transparent substrate (such as quartz or glass, for example), silicon carbide, gallium arsenide, indium phosphide, or germanium.

Preferably, the source substrate 6 is preferably formed from a semiconductor material selected, for example, from silicon, germanium, silicon carbide, silicon and germanium alloys or "compounds" (known as Si—Ge compounds), or alloys or compounds known as III/V compounds (i.e., compounds one element of which is from column IIIa of the periodic table and the other is from column Va, such as gallium nitride, gallium arsenide, or indium phosphide).

Finally, it should be noted that it is possible to cover the front face 700 of the support 7 with an insulating layer of the oxide type (for example $SiO_2$) or of the nitride type (for example $Si_3N_4$). This insulating layer can then be interposed between the useful layer 63 and the support 7 after detaching said layer 63.

It is possible to cover the front face 600 of the source substrate 6 with an insulating material of the type mentioned above; the transferred useful layer 63, would then comprise two layers. It is even possible to deposit a plurality of layers onto the source substrate 6, and the term "useful layer" could then designate a stack of layers.

The substrates are preferably of bulk material that is preferably commercially available, such as wafers sliced from ingots. An ingot is typically a mass of raw material, and the general form or shape of the ingot may vary. The ingot may be generally cylindrical in shape with two substantially conical ends, or it may be elongate, or tubular. The ingot may have a non-circular cross section, for example square, hexagonal, or octagonal, with or without two pointed ends, or it may be broadly spherical (known to the skilled person as a "boule"), or it may even be in the form of a cube. The substrates can be bulk material segments taken from the ingot.

When the ingot is elongate in shape, the thick segments can be cut substantially transversally or, in contrast, longitudinally. Typically, two pointed ends of the ingot are trimmed, and the remaining irregular lateral surface is ground and turned to obtain a cylinder of preferably circular cross section. Next, the ingot can be cut into slices using, for example, a circular saw or a wire saw. The rondelles or slices obtained then typically undergo finishing, which can include grinding to obtain a wafer with a uniform thickness, and then polishing at least one of the two opposite faces to obtain a flat surface. Each wafer can be immersed in a series of chemical baths to eliminate the dust and particles that may still subsist on the two faces and which could be a source of subsequent pollution.

While illustrative embodiments of the invention are disclosed herein, it will be appreciated that numerous modifications and other embodiments may be devised by those skilled in the art. Therefore, it will be understood that the appended claims are intended to cover all such modifications and embodiments that come within the spirit and scope of the present invention.

What is claimed is:

1. A composite structure, comprising:
   a first substrate having a first front face that ends at a first outline and a first chamfered face that begins at the first outline and is peripherally positioned about the first front face; and
   a second substrate having a second front face that ends at a second outline of dimensions larger than the first outline;
   wherein the first and second front faces are molecularly bonded to each other with the first outline disposed at least partially within the second outline in an area of overlap, such that a peripheral ring extending around the first front face within the area of overlap in which bonding between the front faces is weak or absent has a maximum width of less than 0.5 mm; and wherein the first substrate includes a further chamfered face peripherally positioned about the first chamfered face and the second substrate includes a further chamfered face peripherally positioned about the second front face wherein the further chamfered faces do not contact each other.

2. The composite structure of claim 1, wherein the first substrate comprises:

a zone of weakness; and a useful layer of semiconductor material disposed between the first front face and the zone of weakness;

wherein the zone of weakness is configured for facilitating splitting the useful layer from a donor portion of the first substrate.

3. The composite structure of claim 1, wherein the first substrate, the second substrate or both substrates comprises a useful layer of semiconductor material at least at their front faces.

4. The composite structure of claim 3, wherein the semiconductor material of the first and second substrates each comprise a different material.

5. The composite structure of claim 1, wherein the first outline is substantially completely disposed within the second outline when the first and second substrates are bonded together.

6. The composite structure of claim 1, wherein the front faces are substantially flat.

7. The composite structure of claim 1, wherein at least one of the front faces comprises an insulator.

8. The composite structure of claim 1, wherein the second front face has a diameter that is at least 0.3 mm greater than the first front face.

9. The composite structure of claim 1, wherein at least one of the substrates is of bulk material.

10. The composite structure of claim 1, wherein at least one of the substrates is silicon carbide, gallium arsenide, gallium nitride, indium phosphide, quartz, glass, silicon, germanium, or silicon germanium.

11. The composite structure of claim 1, wherein at least one of the substrates includes a surface layer of insulating layer of an oxide or nitride.

12. The composite structure of claim 11, wherein the insulating layer is $SiO_2$ or $Si_3N_4$.

13. The composite structure of claim 1, wherein one of the substrates includes a stack of layers.

14. A composite structure comprising:

a first substrate having a first front face that ends at a first outline; and a second substrate having a second front face that ends at a second outline of dimensions larger than the first outline;

wherein the first and second front faces are molecularly bonded to each other with the first outline disposed at least partially within the second outline in an area of overlap, such that a peripheral ring extending around the first front face within the area of overlap in which bonding between the front faces is weak or absent has a maximum width of less than 0.5 mm, and the first substrate comprises a first primary chamfer extending around the first front face from the first outline and the primary chamfer is at least partially disposed within the second outline when the first and second substrates are bonded together; and wherein the first substrate includes a further chamfered face peripherally positioned about the first primary chamfer and the second substrate includes a further chamfered face peripherally positioned about the second front face wherein the further chamfered faces do not contact each other.

15. The composite structure of claim 14, wherein the first outline is disposed substantially entirely within the second outline.

16. A composite structure comprising:

a first substrate having a first substantially flat front face that ends at a first outline and a first chamfered face that begins at the first outline and is peripherally positioned about the first front face; and a second substrate having a second substantially flat front face that ends at a second outline of dimensions larger than the first outline and a second chamfered face that begins at the second outline and is peripherally positioned about the second flat first front face;

wherein the first and second faces are molecularly bonded to each other with the first chamfered face of the first flat front face disposed completely within the second outline of the second flat front face so that the first chamfered face does not contact the second chamfered face; and wherein the first substrate includes a further chamfered face peripherally positioned about the first chamfered face and the second substrate includes a further chamfered face peripherally positioned about the second chamfered face wherein the further chamfered faces do not contact each other.

* * * * *